(12) United States Patent
Onishi et al.

(10) Patent No.: US 8,632,295 B2
(45) Date of Patent: Jan. 21, 2014

(54) TRANSPORTING SYSTEM, AND TEACHING METHOD IN THE TRANSPORTING SYSTEM

(75) Inventors: Hisashi Onishi, Ise (JP); Taro Yamamoto, Ise (JP); Shinji Fujioka, Ise (JP); Nobuhiro Gunge, Ise (JP)

(73) Assignee: Murata Machinery, Ltd., Kyoto-Shi (JP)

( * ) Notice: Subject to any disclaimer, the term of this patent is extended or adjusted under 35 U.S.C. 154(b) by 904 days.

(21) Appl. No.: 12/183,100

(22) Filed: Jul. 31, 2008

(65) Prior Publication Data

US 2009/0035104 A1 Feb. 5, 2009

(30) Foreign Application Priority Data

Aug. 3, 2007 (JP) .................................. 2007-202542

(51) Int. Cl.
*B66C 3/00* (2006.01)

(52) U.S. Cl.
USPC .......................................................... 414/785

(58) Field of Classification Search
None
See application file for complete search history.

(56) References Cited

U.S. PATENT DOCUMENTS

2003/0198540 A1* 10/2003 Lin et al. ...................... 414/217

FOREIGN PATENT DOCUMENTS

| JP | 11-349280 | 12/1999 |
|---|---|---|
| JP | 2003-192269 | 7/2003 |
| JP | 2005-170544 | 6/2005 |
| JP | 2006-069687 | 3/2006 |
| JP | 2006-282303 | 10/2006 |
| TW | 494079 | 7/2002 |
| TW | 530330 | 5/2003 |
| TW | 200413204 | 8/2004 |

OTHER PUBLICATIONS

JP Office Action dated Oct. 16, 2012, Application No. 2007-202542.
Taiwanese Office Action dated Feb. 7, 2013 in corresponding Taiwanese Patent Application No. 97129200.

* cited by examiner

*Primary Examiner* — Saul Rodriguez
*Assistant Examiner* — Willie Berry, Jr.
(74) *Attorney, Agent, or Firm* — Young & Thompson

(57) ABSTRACT

A transporting system includes: a track portion; a plurality of loading platforms, disposed along the track portion, whose positions differ from each other in at least one direction; a plurality of transporting vehicles, each having a travelling device travelling along the track portion and a loading device, for loading transported objects; a first detecting device for detecting a first reference position, of the loading device when a reference transporting vehicle loads the transported object; a second detecting device for detecting a second reference position, of the loading device when each of the other transporting vehicles other than the reference transporting vehicle loads the transported object; and a teaching device for providing information on the position of the loading device with respect to each of the other loading platforms when each of the other transporting vehicles loads the transported object, on the basis of the detected first and second reference positions.

7 Claims, 7 Drawing Sheets

|  | Y < −30mm | −30mm ≦ Y ≦ 30mm | 30mm < Y |
|---|---|---|---|
| Z ≦ 800mm | First reference loading platform<br>X = ○○mm<br>Y = □□mm<br>Z = △△mm<br>θ = ☆☆mm | Second reference loading platform<br>• • • • | Third reference loading platform<br>• • • • |
| Z > 800mm | Fourth reference loading platform<br>• • • • | Fifth reference loading platform<br>• • • • | Sixth reference loading platform<br>• • • • |

FIG. 6

TRANSPORTING SYSTEM, AND TEACHING METHOD IN THE TRANSPORTING SYSTEM

BACKGROUND OF THE INVENTION

1. Field of the Invention

The present invention relates to a transporting system provided with a transporting apparatus for transporting a transported object, for example, various substrates and the like for manufacturing semiconductor devices, on a track portion, and a teaching method in the transporting system. Here, the "transported object" means a product, an intermediate product, a part, an article, a work, a partly-finished good, a good or the like, or means a box or container for containing such a product or the like, which has been transported or is to be transported by the apparatus.

2. Description of the Related Art

As this type of transporting system, there is a system having a transporting apparatus of an OHT (Overhead Hoist Transport) type, which travels on the track portion, installed on or near the ceiling. In the system, transfer is made by the transporting device gripping or holding a transported object. In such a transporting system, in order that the transporting apparatus can certainly grip the transported object, teaching is provided about the stop position and the like of the transporting apparatus in performing the transfer.

For example, Japanese Patent Application Laying Open NO. Hei 11-349280 discloses a technology of teaching by detecting a shift amount in the stop position of the transporting apparatus. Moreover, Japanese Patent Application Laying Open NO. 2005-170544 discloses a technology of teaching by detecting a shift amount in the stop position with a recognition mark. Furthermore, Japanese Patent Application Laying Open NO. 2006-69687 discloses a technology of teaching with the correction value of a spatial coordinate position.

However, in some cases, the shift amount and the like of the stop position used in teaching cause errors depending on a positional relationship between the transporting apparatus and the transported object. In particular, the errors are significant when transfer is made by elongating or hoisting a gripping device, which grips the transported object, from the transporting apparatus main body, for example, by the winding and unwinding of a lifting belt or the like, or when a loading device is slid from a traveling device to the side of a track, such as lateral transfer, or in similar cases. Thus, like the aforementioned technologies, if teaching is provided by detecting the shift amount under one condition or in similar cases, there is such a technical problem that accurate teaching is not provided.

SUMMARY OF THE INVENTION

It is therefore an object of the present invention to provide a transporting system which allows teaching to transfer the transported object more certainly, and a teaching method in the transporting system.

The above object of the present invention can be achieved by a transporting system provided with: a track portion; a plurality of loading platforms, which are disposed along the track portion, whose positions with respect to the track portion are different from each other in at least one direction, and on each of which a transported object can be placed; a plurality of transporting vehicles, each having (i) a travelling device travelling along the track portion and (ii) a loading device, which is mounted on the travelling device, which can move in the at least one direction, and which can load the transported object placed on each of the plurality of loading platforms; a first detecting device for detecting a first reference position, which is a position of the loading device with respect to each of the plurality of loading platforms, when a reference transporting vehicle loads the transported object, with at least one of the plurality of transporting vehicles being regarded as the reference transporting vehicle; a second detecting device for detecting a second reference position, which is a position of the loading device with respect to each of reference loading platforms, when each of the other transporting vehicles other than the reference transporting vehicle among the plurality of transporting vehicles loads the transported object, with at least two of the plurality of loading platforms being regarded as the reference loading platforms whose positions are different from each other in the at least one direction; and a teaching device for providing teaching related to the position of the loading device with respect to each of the other loading platforms other than the reference loading platforms among the plurality of loading platforms when each of the other transporting vehicles loads the transported object, on the basis of the detected first and second reference positions.

According to the transporting system of the present invention, in its operation, firstly, at least one of the plurality of transporting vehicles is regarded as the reference transporting vehicle, and the first reference position is detected by the first detecting device, wherein the first reference position is the position of the loading device with respect to each of the plurality of loading platforms when the reference transporting vehicle loads the transported object. The first reference position is typically detected for all the plurality of loading platforms. That is, the plurality of first reference positions for the plurality of loading platforms are detected. Incidentally, the "position" here includes spatial coordinates of the loading device (i.e. X, Y, and Z coordinates) or the like, or any parameter that can specify the position of the loading device. For example, if the loading device does not move or is not displaced, one parameter indicating the position on the track portion of the traveling device is enough. The same is true for a second reference position described later.

The plurality of loading platforms are disposed along the track portion and such that the platforms differ in position from each other with respect to the track portion in at least one direction. Incidentally, "along the track portion" means that the platforms may be disposed in a range where the placed transported objects can be loaded by the transporting vehicles. Moreover, "the loading platforms . . . differ in position from each other" is not limited to the meaning that the positions of all the loading platforms are different from each other, but may mean that the position of at least one loading platform and the positions of another one or other loading platforms are different from each other. For example, a case where there are a loading platform which is tall and a loading platform which is short in a vertical direction is the case that "the loading platforms . . . differ in position from each other" herein. Moreover, at least one direction in which the loading platforms differ in position from each other is a direction in which the loading device provided for the transporting vehicle can move.

The first reference position can be detected, for example, when the reference transporting vehicle loads the transported objects placed on each of the plurality of loading platforms. The transporting vehicle travels on the track portion using the travelling device to approach each of the loading platforms, moves or displaces the loading device to the position where the transported object placed on the loading platform can be loaded, and loads the transported object. Thus, with the transported object being placed on the loading platform, it is only necessary to move or displace the loading device so as to load the transported object, and detect the position of the loading device when the loading is actually performed. Incidentally, it is possible to detect the first reference position even if the transported object is not actually loaded.

When the first reference position is detected, at least two loading platforms which differ in position in at least one direction are regarded as the reference loading platforms. Then, the second reference position is detected by the second detecting device, wherein the second reference position is the position of the loading device with respect to the reference loading platforms when each of the other transporting vehicles loads the transported object. The second reference position, as in the first reference position described above, can be detected when each of the other transporting vehicles load the transported objects placed on the reference loading platforms. Incidentally, here, at least two loading platforms are regarded as the reference loading platforms, so at least two second reference positions are detected for the respective other transporting vehicles.

When the second reference positions are detected, the teaching is provided about the position of the loading device with respect to each of the other loading platforms other than the reference loading platforms, among the plurality of loading platforms, when each of the other transporting vehicles load the transported objects, on the basis of the first and second reference positions. Incidentally, "teaching" means that the other transporting vehicles other than the reference transporting vehicle perform positional correction so as to load the transported object placed on the loading platform other than the reference loading platform in which the positional detection is not performed, on the basis of the position of the loading device (i.e. the first reference position) when the reference transporting vehicle loads the transported object. Typically, it is performed by obtaining a difference between the first reference position and the second reference position and correcting the difference.

Here, in particular, in the present invention, the teaching can be provided for each reference loading platform since the second reference position is detected for at least two reference loading platforms which differ in position from each other, as described above. In other words, the teaching can be provided, separately, based on the difference of a moving amount (or distance) when the loading device loads the transported object. More specifically, for example, different positional correction can be made between when the transported object placed on the loading platform far from the track portion is loaded and when the transported object placed on the close loading platform is loaded. Thus, the teaching can be provided in view of errors caused by the movement or displacement of the loading device (i.e. errors in a shift from the first reference position if the loading device has different moving amounts or distances). Incidentally, reducing the number of the reference loading platforms allows shorter-time and easier teaching, and increasing the number allows more accurate teaching.

As explained above, according to the transporting system of the present invention, it is possible to provide more accurate teaching. Therefore, the transporting vehicle can load the transported object, more certainly.

In one aspect of the transporting system of the present invention, the plurality of loading platforms are disposed to differ in position from each other in a crossing direction, which crosses a horizontal direction, as the at least one direction, the loading device can rise or fall in the crossing direction, and the loading platforms which differ in position from each other in the crossing direction, among the plurality of loading platforms, are set as the reference loading platforms.

According to this aspect, the plurality of loading platforms are disposed such that the platforms differ in position from each other at least in the crossing direction, which crosses the horizontal direction. The loading device provided for the transporting vehicle can rise or fall in the crossing direction. Incidentally, the "crossing direction, which crosses the horizontal direction" is typically a vertical direction, but does not necessarily mean a strict vertical direction. That is, "rise or fall" may be moving obliquely downward or obliquely upward. Since the loading device can rise or fall, the loading device can load the transported object placed on the loading platform which differs in position the direction crossing the horizontal direction.

Here, in the present invention, particularly, the loading platforms which differ in position in the direction crossing the horizontal direction, of the plurality of loading platforms, are set as the reference loading platforms. Typically, the loading platforms which differ in height (e.g. the tall loading platform and the short loading platform) are set as the loading platforms. Thus, the second reference position is detected for each of the loading platforms which differ in position in the direction crossing the horizontal direction. Thus, teaching can be provided in view of errors related to the position of the loading device caused by the rising or falling of the loading device.

In another aspect of the transporting system of the present invention, the plurality of loading platforms are disposed to differ in position from each other in a direction along a horizontal direction, as the at least one direction, the loading device can extend in the direction along the horizontal direction, and the loading platforms which differ in position from each other in the direction along the horizontal direction, among the plurality of loading platforms, are set as the reference loading platforms.

According to this aspect, the plurality of loading platforms are disposed such that the platforms differ in position at least in the direction along the horizontal direction. The loading device provided for the transporting vehicle can extend in the direction along the horizontal direction. Incidentally, the "direction along the horizontal direction" is typically a horizontal direction, but does not necessarily mean a strict horizontal direction. That is, "extend" may be moving obliquely downward or obliquely upward. Since the loading device can extend, the loading device can load the transported object placed on the loading platform which differs in position the direction along the horizontal direction (i.e. lateral transfer).

Here, in the present invention, particularly, the loading platforms which differ in position from each other in the direction along the horizontal direction, of the plurality of loading platforms, are set as the reference loading platforms. Typically, the loading platforms which differ in horizontal distance from the track portion from each other (e.g. the loading platform close to the track portion and the platform far from the track portion) are set as the loading platforms. Thus, the second reference position is detected for each of the loading platforms which differ in position from each other in the direction along the horizontal direction. Thus, teaching can be provided in view of errors related to the position of the loading device caused by the extension of the loading device.

In another aspect of the transporting system of the present invention, the plurality of loading platforms are disposed to differ from each other in position in a crossing direction, which crosses a horizontal direction, and a direction along a horizontal direction, as the at least one direction, the loading device can rise or fall in the crossing direction and extend in the direction along the horizontal direction, and the loading platforms which differ in position from each other in at least one of the crossing direction and the direction along the horizontal direction, among the plurality of loading platforms, are set as the reference loading platforms.

According to this aspect, the plurality of loading platforms are disposed such that the platforms differ in position at least in (i) the crossing direction, which crosses the horizontal direction, and (ii) the direction along the horizontal direction. The loading device provided for the transporting vehicle can rise or fall in the crossing direction and can extend in the direction along the horizontal direction. Since the loading device can rise or fall and extend, the loading device can load the transported object placed on the loading platform which differs in position the direction crossing the horizontal direction and the direction along the horizontal direction.

Here, in the present invention, particularly, the loading platforms which differ from each other in position in the direction crossing the horizontal direction and the direction along the horizontal direction, of the plurality of loading platforms, are set as the reference loading platforms. Thus, the second reference position is detected for each of the loading platforms which differ from each other in position in the direction crossing the horizontal direction and the direction along the horizontal direction. Thus, teaching can be provided in view of errors related to the position of the loading device caused by the rising or falling and extension of the loading device. In this aspect, the loading device can move (rise or fall, and extend) in the two directions, there is a possibility to have more significant errors related to the position of the loading device caused by the displacement. Therefore, by providing the teaching as described above, it is possible to increase the accuracy, more effectively.

In another aspect of the transporting system of the present invention, a pair of loading platforms, which differ in position from each other in the at least one direction in a relatively great magnitude, among the plurality of loading platforms, are set as the reference loading platforms.

According to this aspect, the pair of loading platforms which differ in position in the at least one direction relatively significantly, of the plurality of loading platforms, are set as the reference loading platforms, and the second reference position is detected for each of the reference loading platforms. Incidentally, the "pair of loading platforms which differ in position in the at least one direction in a relatively great magnitude" means the pair of loading platforms which differ in position from each other more significantly, as compared to each of another one pair or a plurality of pairs extracted from the plurality of loading platforms. Ideally, the pair of loading platforms which differ in position from each other most significantly are set as the reference loading platforms, but in practice, the pair of loading platforms which differ in position beyond a threshold value set in advance may be set as the reference loading platforms.

If the pair of loading platforms which differ in position from each other relatively great magnitude are set as the reference loading platforms, the second reference position is detected for each case where the loading device has relatively significant different moving amounts (or distances). The more significantly different the moving amount (or distance) of the loading device is, the greater the errors related to the position of the loading device is considered to be. Thus, if the second reference positions are detected in the case where these have the different moving amounts (or distances) to the greater degrees, then it is possible to perform the positional correction, more effectively.

As explained above, according to the transporting system in this aspect, it is possible to increase the teaching accuracy, more effectively.

In another aspect of the transporting system of the present invention, it is further provided with: a tag, provided for the transported object and storing therein information for recognizing the transported object; and an antenna provided for the travelling device and capable of reading the information, the loading device being capable of displacing the loaded transported object to a position where the information can be read by the antenna.

According to this aspect, the transported object is provided with the tag storing therein the information for recognizing the transported object. Moreover, the travelling device is provided with the antenna capable of reading the information stored in the tag provided for the transported object. In the tag, for example, a recognition number or the like for recognizing the transported object is recorded as the information. The tag is, for example, a RFID tag or the like, and reading is performed by approaching the antenna to the tag.

Here, in this aspect, particularly, by the loading device moving, it is possible to displace the transported object to the position where the information stored in the tag can be read by the antenna. Thus, it is possible to read the information in the tag provided for the loaded transported object and certainly recognize the transported object.

For example, in some type of tag, a communication distance between the tag and the antenna is short, and it is necessary to approach the tag to the antenna, extremely closely (e.g. several cm order); otherwise the information cannot be read. Putting it in another way, if it is constructed to read the information even in a distant position, signals from many tags are mixed, which makes the reading of the information difficult, so in practice, the communicable distance between the tag and the antenna is set to be extremely short. In such a case, by that the loading device displaces the transported object such that the tag and the antenna are located closely to each other, it is possible to perform the reading, certainly. Incidentally, such an operation can be performed even when detecting the first and second reference positions described above and providing the teaching.

Moreover, if the transported object provided with the tag can be displaced to the position where the information can be read, it is possible to increase the degree of freedom of the disposed position of the antenna in designing, and for example, it is possible to dispose the antenna to a position where not to prevent the displacement when the loading device loads the transported object.

As explained above, according to the transporting system in this aspect, it is possible to certainly recognize the loaded transported object. Moreover, since the antenna has high degree of freedom of the disposed position, it is extremely useful in designing.

In the aspect in which the tag and the antenna are provided, described above, it may be further provided with: a detecting device for detecting a readable position, which is a position where the information can be read, by monitoring the information read by the antenna while continuously or intermittently moving the loading device between an unreadable position where the information cannot be read by the antenna and the readable position where the information can be read, with the transported object being loaded on the loading device, the teaching device further providing the teaching about the readable position where the information can be read, on the basis of at least the detected readable position.

By virtue of such construction, the loading device with the transported object loaded continuously or intermittently moves or is displaced between the unreadable position where the information stored in the tag cannot be read by the antenna and the readable position where the information can be read, with the transported object being loaded on the loading device. For example, it performs a reciprocating operation or the like in small motions in the position where the antenna and the tag are close. Then, by monitoring the information read by the antenna, the readable position is detected where the information can be read.

Then, on the basis of the detected readable position, the teaching related to the position where the information can be read is provided. Thus, in another transporting vehicle, if the transported object is displaced to the position indicated by the teaching, it is possible to read the information, certainly. Incidentally, such teaching may be provided on the basis of the first and second reference positions, in addition to the readable position.

As explained above, according to the transporting system in this aspect, the information can be read in another transporting vehicle, in a shorter time and easily. Therefore, it is possible to efficiently perform the transportation while certainly recognizing the transported object.

The above object of the present invention can be also achieved by a teaching method in a transporting system provided with: a track portion; a plurality of loading platforms, which are disposed along the track portion, whose positions with respect to the track portion are different from each other in at least one direction, and on each of which a transported object can be placed; and a plurality of transporting vehicles, each having (i) a travelling device travelling along the track portion and (ii) a loading device, which is mounted on the travelling device, which can move in the at least one direction, and which can load the transported object placed on each of the plurality of loading platforms, said teaching method comprising: a first detecting process of detecting a first reference position, which is a position of the loading device with respect to each of the plurality of loading platforms, when a reference transporting vehicle loads the transported object, with at least one of the plurality of transporting vehicles being regarded as the reference transporting vehicle; a second detecting process of detecting a second reference position, which is a position of the loading device with respect to each of reference loading platforms, when each of the other transporting vehicles other than the reference transporting vehicle among the plurality of transporting vehicles loads the transported object, with at least two of the plurality of loading platforms being regarded as the reference loading platforms whose positions are different from each other in the at least one direction; and a teaching process of providing teaching related to the position of the loading device with respect to each of the other loading platforms other than the reference loading platforms among the plurality of loading platforms when each of the other transporting vehicles loads the transported object, on the basis of the detected first and second reference positions.

According to the teaching method in the transporting system of the present invention, it is possible to provide the more accurate teaching, as in the case of the transporting system of the present invention described above. Therefore, the transporting vehicle can load the transported object, more certainly.

Incidentally, even in the teaching method in the transporting system of the present invention, it is possible to adopt the same various aspects as those of the transporting system of the present invention described above.

The nature, utility, and further features of this invention will be more clearly apparent from the following detailed description with reference to preferred embodiments of the invention when read in conjunction with the accompanying drawings briefly described below.

BRIEF DESCRIPTION OF THE DRAWINGS

FIG. 6 is a table showing a data processing method in teaching; and

DETAILED DESCRIPTION OF THE PREFERRED EMBODIMENT

The embodiment of the present invention will be explained with reference to the drawings hereinafter.

First Embodiment

Figure 1:
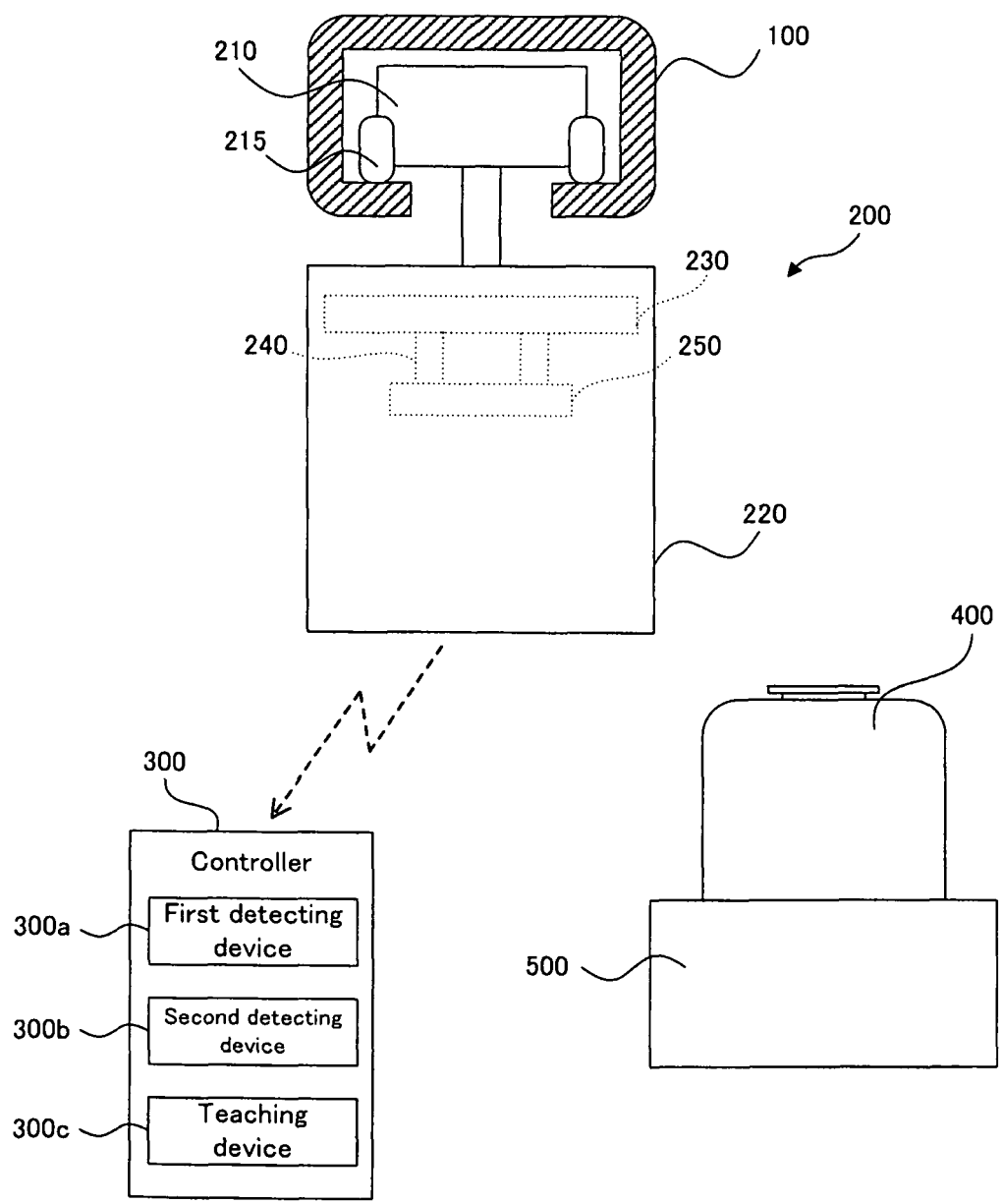
FIG. 1 is a side view showing the structure of a transporting system in a first embodiment.

Firstly, the structure of a transporting system in a first embodiment will be explained with reference to FIG. 1. FIG. 1 is a side view showing the structure of the transporting system in the first embodiment.

In FIG. 1, the transporting system in the embodiment is provided with: a track portion 100; a transporting vehicle 200; a controller 300; and a loading platform 500.

The track portion 100 is installed on or near the ceiling, for example, and is made of metal, such as aluminum and stainless.

The transporting vehicle 200 is provided with: a travelling device 210 and a main body 220, which are one example of the "travelling device" of the present invention; and a moving device 230, a lifting belt 240, and a gripping device 250, which are one example of the "loading device" of the present invention. The transporting vehicle 200 travels on the track portion 100 with travelling rollers 215 rolling, by the travelling device 210 providing a thrust, for example, with a linear motor or the like. On the undersurface of the travelling device 210, a main body device 220 is mounted to be hanging from the travelling device 210. Moreover, the moving device 230 is mounted on the main body device 220. The moving device 230 can move to the side of the track portion 100 (i.e. a horizontal direction in FIG. 1). That is, the moving device 230 is of a lateral transfer type. On the undersurface of the moving device 230, the gripping device for gripping a transported object 400 is mounted by a lifting belt 240. The gripping device 250 can rise and fall with respect to the main body device 220 by winding (or hoisting) and unwinding (or dehoisting) the lifting belt 240.

There are a plurality of aforementioned transporting vehicles 200 disposed on the track portion 100, and each transporting vehicle 200 travels independently or collaboratedly, to thereby transport the transported object.

The controller 300 includes, for example, an arithmetic circuit, a memory, and the like, and stores inputted data to perform arithmetic processing or the like. Moreover, the controller 300 communicates with the transporting vehicle 200 by wired or wireless connection, to thereby exchange data and control the travel. As detailed later, the controller 300 is provided with: a first detecting device 300a for detecting a first reference position; a second detecting device 300b for detecting a second reference position; and a teaching device 300 for teaching about the position of the loading device with respect to each of loading platforms other than a reference loading platform when transporting vehicles other than a reference transporting vehicle load transported objects, on the basis of the detected first and second reference positions.

A loading platform 500 can place thereon the transported object 400, and a plurality of loading platforms 500 are disposed at positions along the track portion 100. The disposed plurality of loading platforms 500 include those differ in height and horizontal distance from the track portion 100 (refer to 510, 511, and 512 in FIG. 2). Incidentally, the loading platform 500 may be a rack installed such that it is hanging from the ceiling (refer to 513 in FIG. 2), or the like, as well as the one disposed on the ground.

Figure 2:
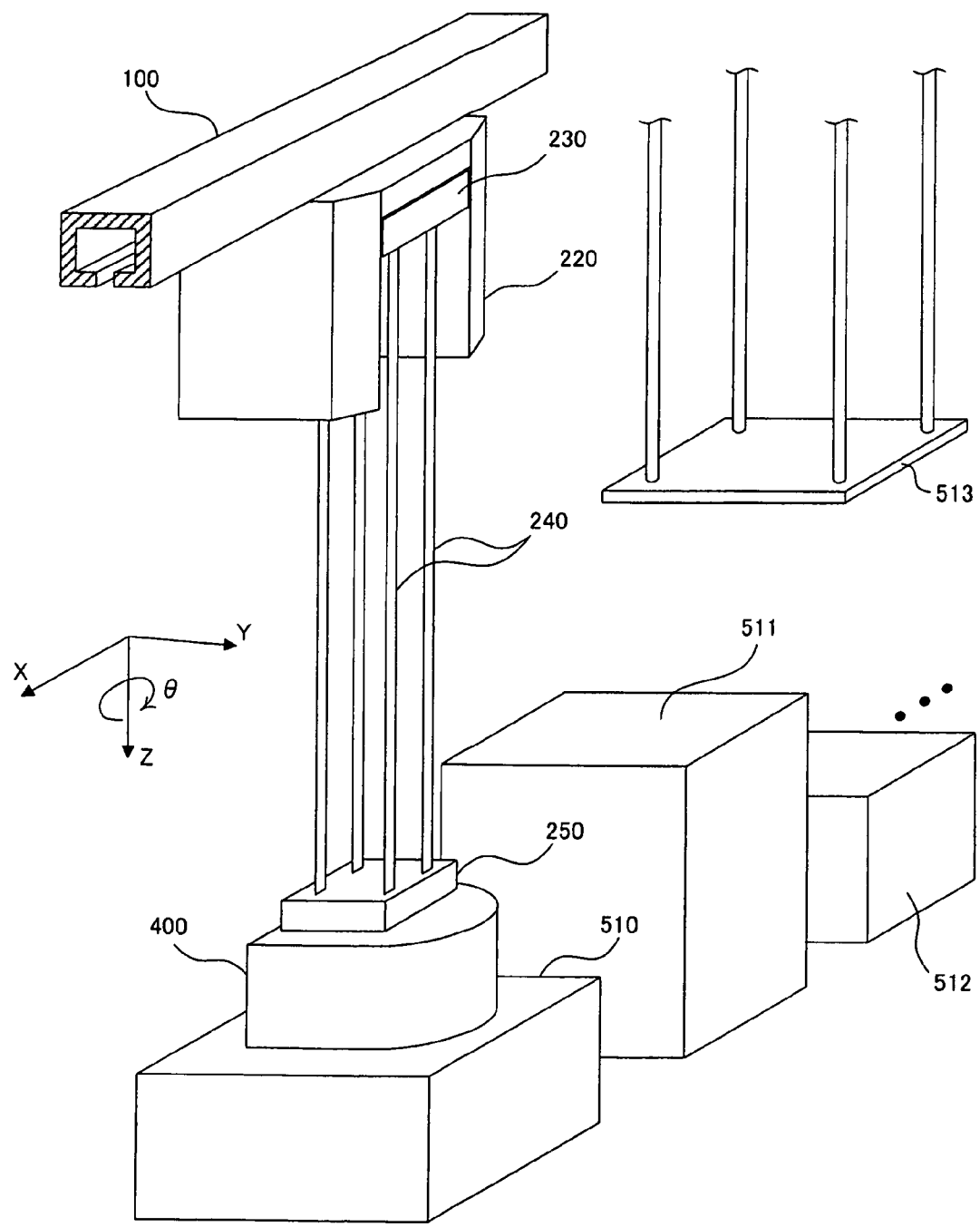
FIG. 2 is a perspective view showing the operation of a transporting vehicle performing transfer of a transported object.
Figure 3:
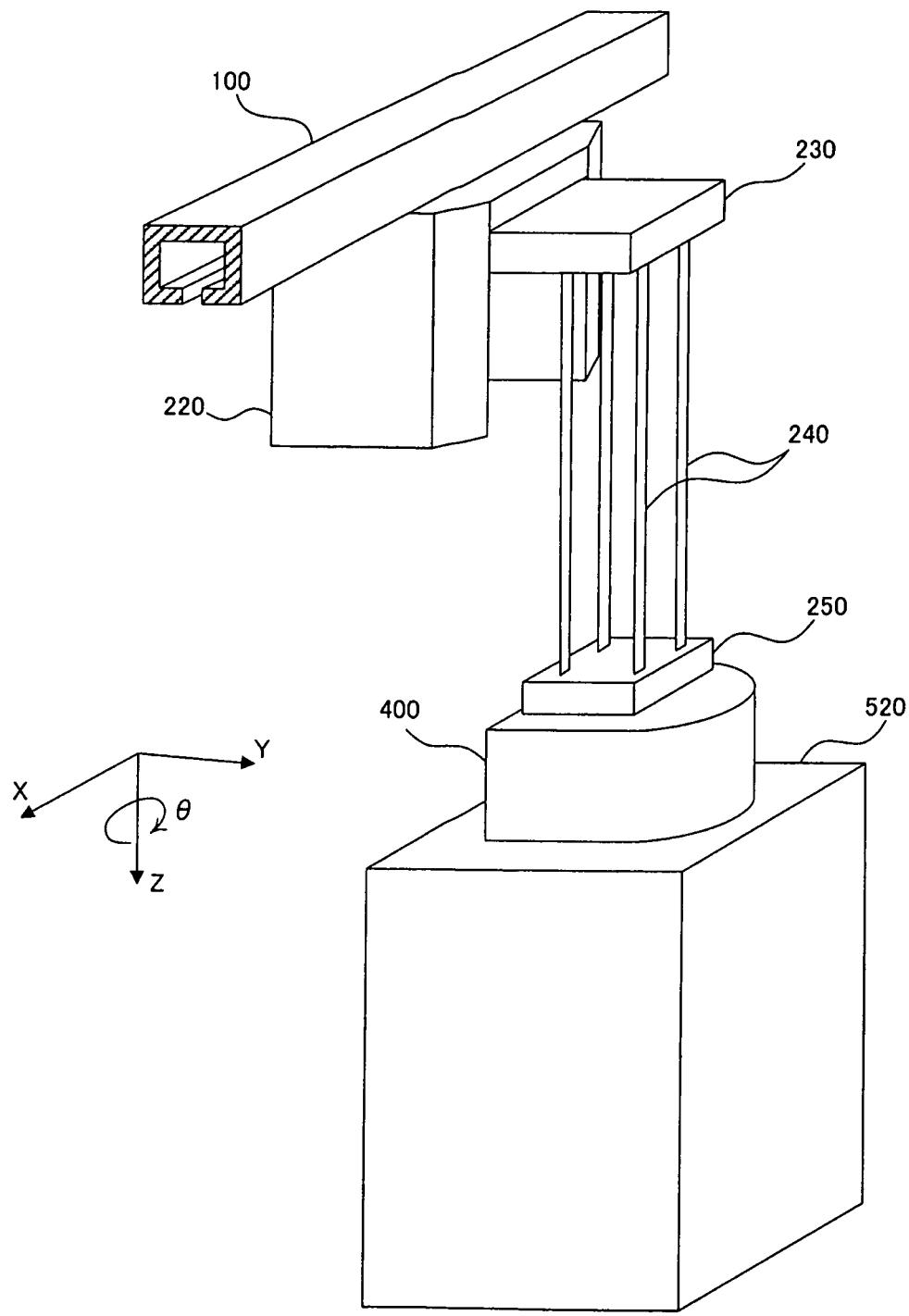
FIG. 3 is a perspective view showing the operation of the transporting vehicle performing lateral transfer of the transported object.

Next, the transfer operation of the transporting system in the first embodiment will be described with reference to FIG. 2 and FIG. 3. FIG. 2 is a perspective view showing the operation of the transporting vehicle performing transfer of the transported object. FIG. 3 is a perspective view showing the operation of the transporting vehicle performing lateral transfer of the transported object.

In FIG. 2, upon the transportation of the transported object 400 in the transporting system in the embodiment, firstly, the transporting vehicle 200 travels on the track portion 100 and stops above the transported object 400 placed on the loading platform 510. Then, as shown in FIG. 2, the lifting belts 240 are unwound (or dehoisted), by which the gripping device 250 falls or descends to the position of the transported object 400. Then, the gripping device 250 is rotated in a direction of $\theta$ (i.e. a rotational direction with a Z axis as a rotational axis in FIG. 2) for fine positioning with respect to the transported object 400, to thereby grip the transported object 400. Once the transported object 400 is gripped, the lifting belt 240 is wound (or hoisted), and the gripping device 250 and the gripped transported object 400 rise or ascend to the position of the main body device 220. Then, the transporting vehicle 200 travels on the track portion 100 again, to thereby transport the transported object 400.

In FIG. 3, if the transported object 400 is placed on the loading platform 520 located off to the side of the track portion 100 (i.e. in a Y direction in FIG. 3), the moving device 230 moves to the side of the track portion 100 before the lifting belt 240 is unwound (or dehoisted), and then the gripping device 250 falls or descends to the position of the transported object 400. Such an operation allows the lateral transfer of the transported object 400 from the track portion 100.

The transported object 400 is transferred and transported on the transporting vehicle 200 in the aforementioned processes. In particular, in the embodiment, a teaching operation for alignment between the gripping device 250 and the transported object 400 is performed in advance so that the gripping device 250 can certainly grip the transported object 400 in the transfer.

Figure 4:
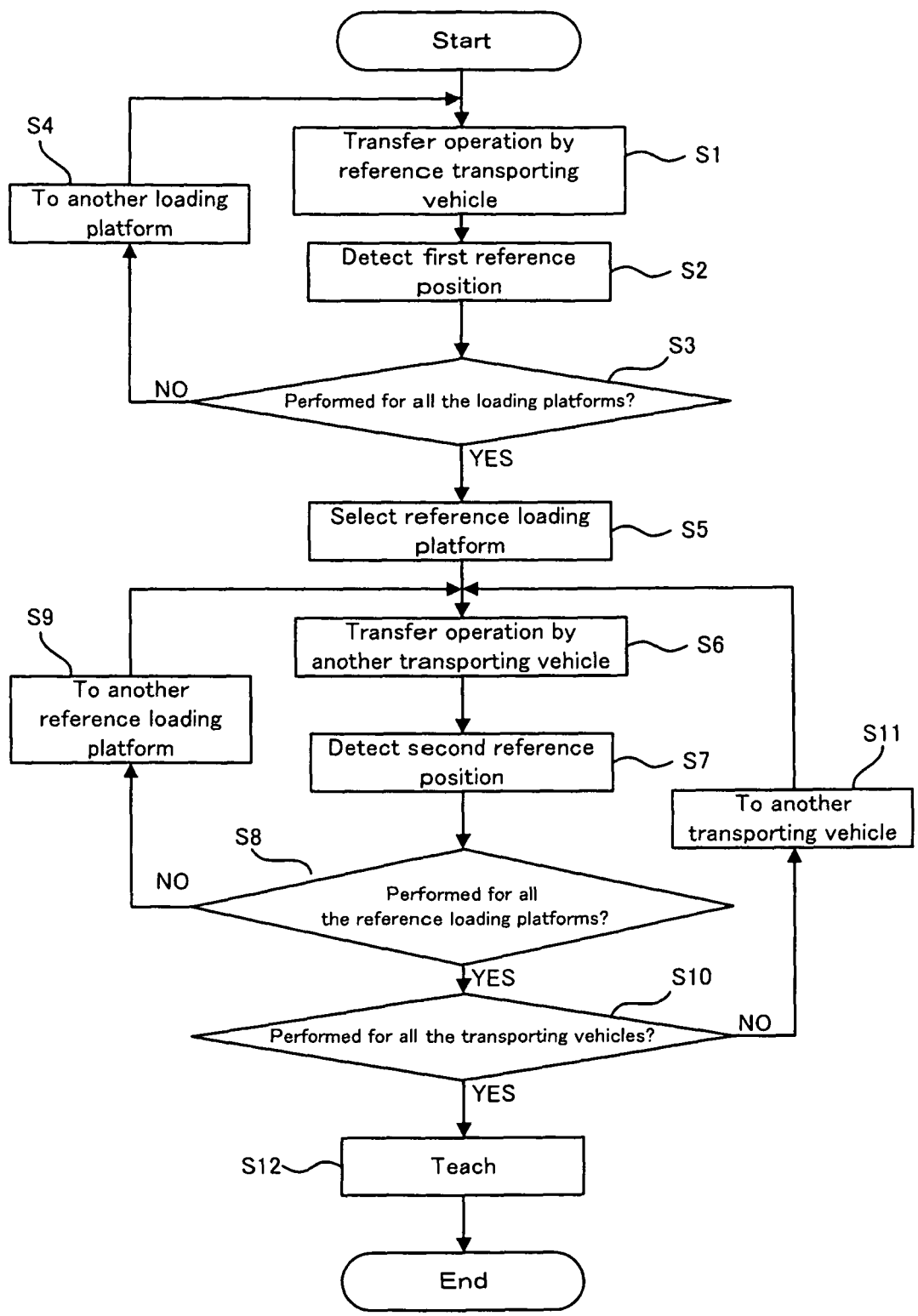
FIG. 4 is a flowchart showing the teaching operation of the transporting system in the first embodiment.
Figure 5:
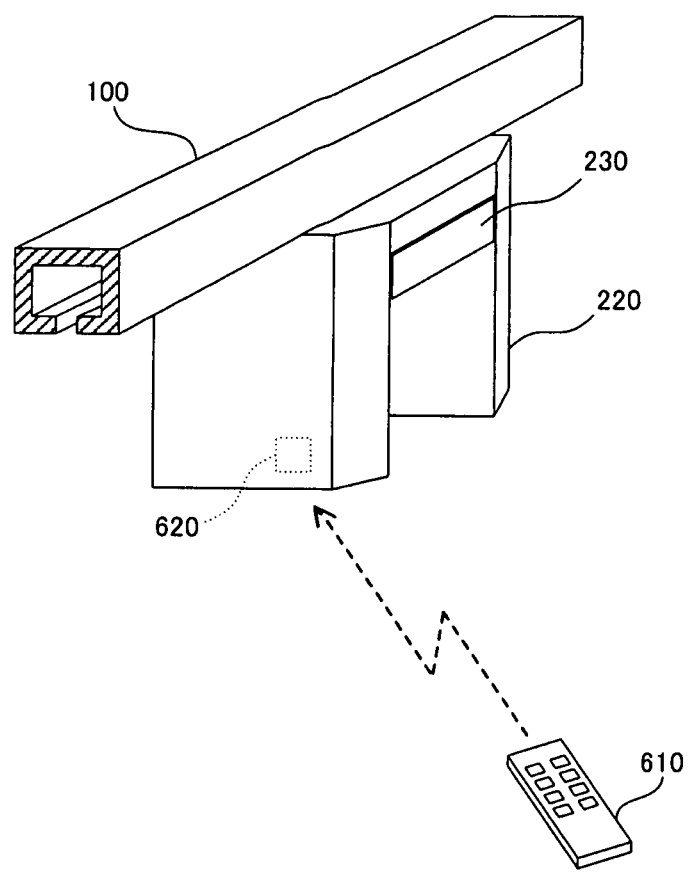
FIG. 5 is a perspective view showing a position detecting operation with a remote controller.

Hereinafter, the teaching operation of the transporting system in the first embodiment will be explained in details, with reference to FIG. 4 to FIG. 6, in addition to FIG. 2 and FIG. 3. FIG. 4 is a flowchart showing the teaching operation of the transporting system in the first embodiment. FIG. 5 is a perspective view showing a position detecting operation with a remote controller. FIG. 6 is a table showing a data processing method in teaching.

In FIG. 4, in operation of the transporting system in the embodiment, firstly, one of the plurality of transporting vehicles 200 is regarded as a reference transporting vehicle, and the reference transporting vehicle performs the transfer operation of transferring the transported object 400 placed on the loading platform 500 (step S1). The transfer operation is performed until the gripping device 250 reaches a position where it can certainly grip the transported object 400.

When the gripping device 250 reaches the position where it can grip the transported object, the first detecting device 300a provided for the controller 300 (refer to FIG. 1) detects the position of the gripping device 250 at that time, as a first reference position (step S2). Incidentally, here, as a parameter indicating the position, it detects the position in the X direction (i.e. the position of the travelling device 210 with respect to the track portion 100) in FIG. 2 and FIG. 3, the position in the Y direction (i.e. the position related to the movement of the moving device 230), the position in the Z direction (i.e. the position related to the rising (or ascending) and falling (or descending) of the gripping device 250), and the position in the $\theta$ direction (i.e. the position related to the rotation of the gripping device 250). Such detection is performed by a not-illustrated position sensor, a sensor for detecting a moving amount (or distance) of the moving device 230 and an unwinding (or dehoisting) amount of the lifting belt 240, or the like. The detected first reference position is sent to and temporarily stored in the controller 300 (refer to FIG. 1).

In FIG. 5, the operations in the step S1 and the step S2 described above can be performed by an operator operating a remote controller 610, for example. In such a case, the transporting vehicle 200 is provided with a receiving device 610 for receiving a signal sent from the remote controller. Specifically, the operator fine-tunes the position in the X, Y, Z, and $\theta$ directions of the gripping device 250 to displace the transporting device 400 to the position where it can be gripped. When the gripping device 250 reaches the position where it grips the transported object 400, an instruction is given to detect the position of the gripping device 250, using the remote controller 610. Moreover, the operation by the remote controller 610 as described above can be also performed in the detection of the second reference position (i.e. a step S6 and a step S7).

Back in FIG. 4, when the first reference position is detected, it is judged whether or not the first reference position is detected for all the plurality of loading platforms 500 (step S3). If the first reference position is not detected for all the plurality of loading platforms 500 (the step S3: NO), the reference transporting vehicle moves to another loading platform in which the first reference position is not detected (step S4), and on the another loading platform, the processes in the step S1 and the step S2 described above are performed. If the first reference position is detected for all the plurality of loading platforms 500 (the step S3: YES), the operational flow goes to a process in the step S5.

Then, on the basis of the detected first reference position, a reference loading platform is selected from the plurality of loading platforms (step S5). With regard to this, at least two reference loading platforms are selected which differ in position at least in one of the X direction, the Y direction, the Z direction, and the $\theta$ direction. For example, like the loading platform 510 in FIG. 2 and the loading platform 520 in FIG. 3, the loading platforms are selected which differ in position in the Y direction and the Z direction.

Then, of the plurality of transporting vehicles 200, by another transporting vehicle other than the reference transporting vehicle, the lateral transfer of the transported object 400 placed on the reference loading platform is performed (step S6). This process is performed in the same manner as in the process in the step S1 described above. That is, it is performed until the gripping device 250 reaches the position where it can certainly grip the transported object 400.

When the gripping device 250 reaches the position where it can certainly grip the transported object, the position of the gripping device 250 at that time is detected as a second reference position by the second detecting device 300b provided for the controller 300 (refer to FIG. 1) (step S7). This process is performed in the same manner as in the process in the step S2 described above. That is, the position in the X, Y, Z, and θ directions of the gripping device 250 is detected as the second reference position, and the detected second reference position is sent to and temporarily stored in the controller 300.

If the second reference position is detected, it is judged whether or not the second reference position is detected for all the reference loading platforms (step S8). If the second reference position is not detected for all the loading platforms (the step S8: NO), the reference transporting vehicle moves to another loading platform in which the second reference position is not detected (step S9), and on the another loading platform, the processes in the step S6 and the step S7 described above are performed. If the second reference position is detected for all the loading platforms (the step S8: YES), the operational flow goes to a process in the step S10.

If one of the other transporting vehicles detects the second reference position for all the reference loading platforms, it is judged whether or not the second reference position is detected for all the other transporting vehicles (step S10). If the second reference position is not detected for all the other transporting vehicles (the step S10: NO), the processes from the step S6 to the step S8 described above are performed on another transporting vehicle in which the second reference position is not detected, of the other transporting vehicles (step S11). If the second reference position is detected for all the other transporting vehicles (the step S10:YES), the operational flow goes to a process in a step S12. Incidentally, here, the detection of the second reference position is performed on each one transporting vehicle; however, possibly, it may be performed simultaneously on the plurality of transporting vehicles. That is, when the second reference position is detected on one reference loading platform with regard to one transporting vehicle, the second reference position may be detected on another reference loading platform with regard to another transporting vehicle. In this manner, the second reference position can be detected, more efficiently.

After the first reference position and the second reference position are detected, the transportation of the transported object 400 by the transporting system is started in practice. Then, when another transporting vehicle transfers the transported object 400, teaching is provided about the position of the gripping device 250, on the basis of the first reference position and the second reference position, by the teaching device 300c provided for the controller 300 (step S12). The teaching is provided, for example, by obtaining a difference between the first reference position and the second reference position and correcting the difference. Hereinafter, taking as an example a case where six reference loading platforms are selected in the step S5, the teaching operation will be explained in details.

In FIG. 6, the six reference loading platforms are selected under the following conditions: the moving amount (or distance) of the gripping device 250 in the Y direction when the transported object 400 placed on each loading platform is greater than 30 mm, within a range of −30 mm to 30 mm, and less than −30 mm, and that in the Z direction is greater than 800 mm and less than or equal to 800 mm. Incidentally, "−" means moving in an opposite direction. Moreover, here, the reference loading platforms are selected with the Y direction and the Z direction as the conditions; however, any movable direction of the gripping device 250 (i.e. the X direction, the θ direction, and the like) can be used as the selecting condition.

Data used for teaching is managed with a table for each one transporting vehicle. That is, tables shown in FIG. 6 are prepared by the number of the transporting vehicles. On the table, values indicating the difference between the first reference position and the second reference position for each reference loading platform are recorded in respective one of the X, Y, Z, and θ directions. When the transported object 400 is transferred by another transporting vehicle, it is determined which value to use of those on the first to sixth reference loading platforms, on the basis of the first reference position detected on the loading platform on which the transferred transported object 400 is placed. Then, the position of the gripping device 250 is corrected using the determined value.

Specifically, for example, if transfer is made on the loading platform in which the first reference position is 20 mm in the Y direction and 500 mm in the Z direction, the value on the second reference loading platform is used since it is "−30 mm≤Y≤30 mm" and "Z≤800 mm". That is, the difference between the first reference position and the second reference position in the second reference loading platform is added to or subtracted from the first reference position, and the gripping device 250 is displaced to the position indicated by the calculated value.

By performing the teaching operation as described above, it is possible to perform teaching in view of errors which occur due to the difference in the moving distance of the gripping device 250. Thus, the teaching can be performed at higher accuracy. Therefore, the transporting vehicle 200 can certainly transfer the transported object 400.

Second Embodiment

Figure 7:
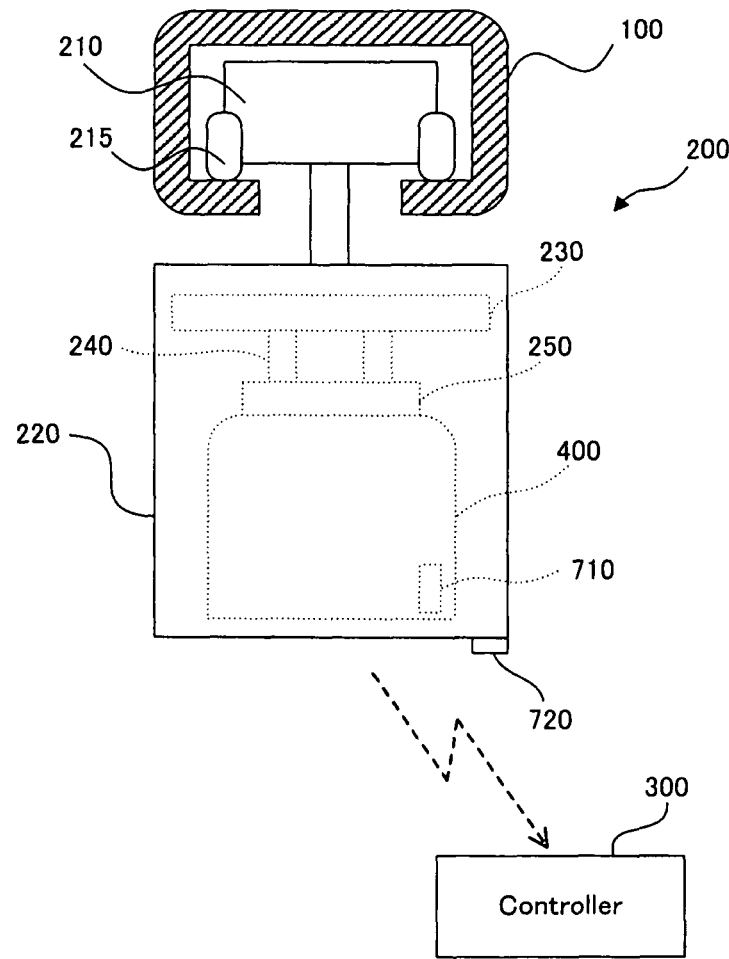
FIG. 7 is a side view showing the structure of a transporting system in a second embodiment.

Next, a transporting system in a second embodiment will be explained with reference to FIG. 7. FIG. 7 is a side view showing the structure of a transporting system in a second embodiment. Incidentally, the second embodiment differs in that a RFID tag is provided for the transported object, as compare to the first embodiment described above, and the other structure and operation are substantially the same. Thus, in the second embodiment, the different part from the first embodiment described above will be explained in details, and the explanation on the other structure and operation will be omitted, as occasion demands.

In FIG. 7, the transporting system in the second embodiment is provided with a tag 710 and an antenna 720, in addition to the structure of the transporting system in the first embodiment described above.

The tag 710 is, for example, a RFID tag or the like, and is provided for the transported object 400. The tag 710 stores therein information for recognizing the transported object (e.g. identification number or the like).

The antenna 720 is placed not to prevent the gripping device 250 from moving. The antenna 720 can read the information stored in the tag 710, by wirelessly communicating with the tag 710. Then, the antenna 720 sends the read information to the controller 300.

The information in the tag 710 is read by the antenna 720, for example, if the transported object 400 is transferred and fit into a position shown in FIG. 7. However, in case of the tag 710 having a short communication distance from the antenna 720 such that it obtains an electric power from the antenna 720 using a noncontact power transfer technology, there is a possibility that the tag 710 is not in a position where the reading by the antenna 720 can be performed and thus the information cannot be read. Moreover, as described above, the antenna 720 is placed not to prevent the gripping device 250 from moving, and it is not always disposed in an optimal position to the reading of the tag 710. Thus, in the transporting vehicle 220 in which the gripping device 250 moves, there is a higher possibility that the tag 710 cannot be read.

In such a case, the transporting system in the second embodiment displaces the gripping device 250 to change the position of the transported object 400, to thereby displace the tag 710 to a position where the tag 710 can be read by the antenna 720. Thus, the antenna 720 can certainly read the information in the tag 710. Moreover, the aforementioned moving operation applies a mechanism used in transferring the transported object 400, so that a new moving mechanism does not have to be provided. Thus, it is possible to prevent an increase in cost.

The transporting system in the second embodiment further provides teaching about the readable position of the tag 710 described above. That is, firstly, on the reference transporting vehicle, the position of the gripping device 250 when the tag 710 can be read by the antenna 720 is detected. More specifically, the readable position is detected by monitoring the readable position and the unreadable position of the tug 710 while continuously or intermittently displacing the gripping device 250. The detected position is sent to and temporarily stored in the controller 300. Then, when the other transporting vehicles other than the reference transporting vehicle read the tag 710, the position of the gripping device 250 is corrected on the basis of the position stored in the controller 300. By this, it is possible to easily read the tug 710 in a shorter time.

Incidentally, the reference transporting vehicle here may be difference from the reference transporting vehicle in the teaching related to the transfer of the transported object 400 explained in the first embodiment.

As explained above, according to the transporting system in the second embodiment, it is possible to certainly read the information in the tag 710 in the transfer while recognizing the transported object 400 by the tag 710.

The invention may be embodied in other specific forms without departing from the spirit or essential characteristics thereof. The present embodiments are therefore to be regarded in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2007-202542 filed on Aug. 3, 2007 including the specification, claims, drawings and summary is incorporated herein by reference in its entirety.

What is claimed is:

1. A teaching method in a transporting system comprising:
   a track portion;
   a plurality of loading platforms, which are disposed along the track portion, whose positions with respect to the track portion are different from each other in at least one direction of X direction which is a horizontal direction parallel to the track portion, Y direction which is a horizontal direction perpendicular to the X direction, Z direction which is a vertical direction perpendicular to the X direction and the Y direction respectively, and θ direction which is a rotation direction round on the Z axis, and on each of which a transported object can be placed; and a plurality of transporting vehicles, each having (i) a travelling device travelling along the track portion and (ii) a loading device, which is mounted on the travelling device, which can move in the Y direction and the Z direction and which can load the transported object placed on each of the plurality of loading platforms, said teaching method comprising:
   a first detecting process of detecting a first reference position, at least the Y direction and the Z direction as a parameter, which is a position of the loading device with respect to each of the plurality of loading platforms, when a reference transporting vehicle loads the transported object, with at least one of the plurality of transporting vehicles being regarded as the reference transporting vehicle;
   a second detecting process of detecting a second reference position, at least the Y direction and the Z direction as a parameter, which is a position of the loading device with respect to each of reference loading platforms, when each of the other transporting vehicles other than the reference transporting vehicle among the plurality of transporting vehicles loads the transported object, with at least two of the plurality of loading platforms being regarded as the reference loading platforms whose positions are different from each other in at least one direction of the Y direction and the Z direction;
   a storing process of storing the first reference and the second reference position; and
   a teaching process of providing teaching related to the position of the loading device with respect to each of the other loading platforms other than the reference loading platforms among the plurality of loading platforms when each of the other transporting vehicles loads the transported object, by obtaining a difference between the first reference position and the second reference position and correcting the difference, wherein
   the plurality of transporting vehicles include at least one transporting vehicle which is the reference transporting vehicle, and other transporting vehicle which are not the reference transporting vehicle, and
   the plurality of loading platforms include at least two loading platforms which are the reference loading platforms, and other loading platforms which are not the reference loading platforms.

2. The teaching method according to claim 1, wherein
   the plurality of loading platforms are disposed to differ in position from each other in the Z direction,
   the loading device can rise or fall in the Z direction, and
   the loading platforms which differ in position from each other in the Z direction, among the plurality of loading platforms, are set as the reference loading platforms.

3. The teaching method according to claim 1, wherein
   the plurality of loading platforms are disposed to differ in position from each other in the Y direction,
   the loading device can extend in the direction along the Y direction, and
   the loading platforms which differ in position from each other in the direction along the Y direction, among the plurality of loading platforms, are set as the reference loading platforms.

4. The teaching method according to claim 1, wherein
   the plurality of loading platforms are disposed to differ from each other in the Z direction, and the Y direction,
   the loading device can rise or fall in the Z direction and extend in the Y direction, and
   the loading platforms which differ in position from each other in at least one of the Z direction and the Y direction, among the plurality of loading platforms, are set as the reference loading platforms.

5. The teaching method according to claim 1, wherein a pair of loading platforms, which differ in position from each other in at least one direction of the Y direction and the Z direction in a relatively great magnitude, among the plurality of loading platforms, are set as the reference loading platforms.

6. The teaching method according to claim 1, wherein the transportation system further comprises:
   a tag, provided for the transported object and storing therein information for recognizing the transported object; and
   an antenna provided for the travelling device and capable of reading the information,
   the loading device being capable of displacing the loaded transported object to a position where the information can be read by the antenna.

7. The teaching method according to claim 6, wherein the transportation system further comprises:
   a detecting device for detecting a readable position, which is a position where the information can be read, by monitoring the information read by the antenna while continuously or intermittently moving the loading device between an unreadable position where the information cannot be read by the antenna and the readable position where the information can be read, with the transported object being loaded on the loading device,
   the teaching device further providing the teaching about the readable position where the information can be read, on the basis of at least the detected readable position.

\* \* \* \* \*